US006891752B1

(12) United States Patent
Bautista et al.

(10) Patent No.: US 6,891,752 B1
(45) Date of Patent: May 10, 2005

(54) SYSTEM AND METHOD FOR ERASE VOLTAGE CONTROL DURING MULTIPLE SECTOR ERASE OF A FLASH MEMORY DEVICE

(75) Inventors: Edward V. Bautista, Santa Clara, CA (US); Ken Cheong Cheah, Penang (MY); Weng Fook Lee, Penang (MY)

(73) Assignee: Advanced Micro Devices, Sunnyvale, CA (US)

(*) Notice: Subject to any disclaimer, the term of this patent is extended or adjusted under 35 U.S.C. 154(b) by 85 days.

(21) Appl. No.: 10/210,378

(22) Filed: Jul. 31, 2002

(51) Int. Cl.[7] .......... G11C 16/04

(52) U.S. Cl. .......... 365/185.11; 365/185.18; 365/185.29; 365/185.33

(58) Field of Search .......... 365/185.01, 185.11, 365/185.26, 185.29, 185.33

(56) References Cited

U.S. PATENT DOCUMENTS

| | | | | |
|---|---|---|---|---|
| 5,270,979 A | | 12/1993 | Harari et al. | 365/218 |
| 5,396,468 A | * | 3/1995 | Harari et al. | 365/185.01 |
| 5,537,358 A | | 7/1996 | Fong | 365/218 |
| 5,745,410 A | * | 4/1998 | Yiu et al. | 365/185.29 |
| 5,751,637 A | * | 5/1998 | Chen et al. | 365/185.33 |
| 6,055,184 A | | 4/2000 | Acharya et al. | 365/185.11 |
| 6,172,909 B1 | * | 1/2001 | Haddad et al. | 365/185.33 |
| 6,188,609 B1 | | 2/2001 | Sunkavalli et al. | 365/185.22 |
| 6,208,558 B1 | | 3/2001 | Chen et al. | 365/185.18 |

FOREIGN PATENT DOCUMENTS

| | | | |
|---|---|---|---|
| EP | 1 225 596 A3 | 7/2002 | G11C/16/10 |
| EP | 1 225 596 A2 | 7/2002 | G11C/16/10 |

* cited by examiner

*Primary Examiner*—Trong Phan

(57) ABSTRACT

A method for erasing a flash memory. In a flash memory device having multiple sectors a plurality of sectors is selected for erase (810). a subset of sectors is selected (815) and an erase pulse is applied simultaneously to all sectors in the subset (820). After the application of an erase pulse having an initial voltage value, at least one sector of the subset is verified (825). If there is at least one unerased cell in the verified sector, the erase voltage is adjusted (830) and another erase pulse is applied to the subset of sectors (820). The adjustment of the erase voltage may be a function of the number of times that an erase pulse has been applied to the subset. This cycle is repeated on the subset until the selected sector is verified as erased. After a sector is verified, the erase/verify cycle is applied to one or more of the remaining sectors in the subset until each of the remaining sectors has been verified as erased. After all of the sectors in the subset are erased, the erase voltage is reset to its initial value (840) and another subset of sectors is selected for erase/verify as described above (815). The process may be repeated until all of the memory sectors in the device have been erased (850). A flash memory device with embedded logic may be used to execute the method.

20 Claims, 12 Drawing Sheets

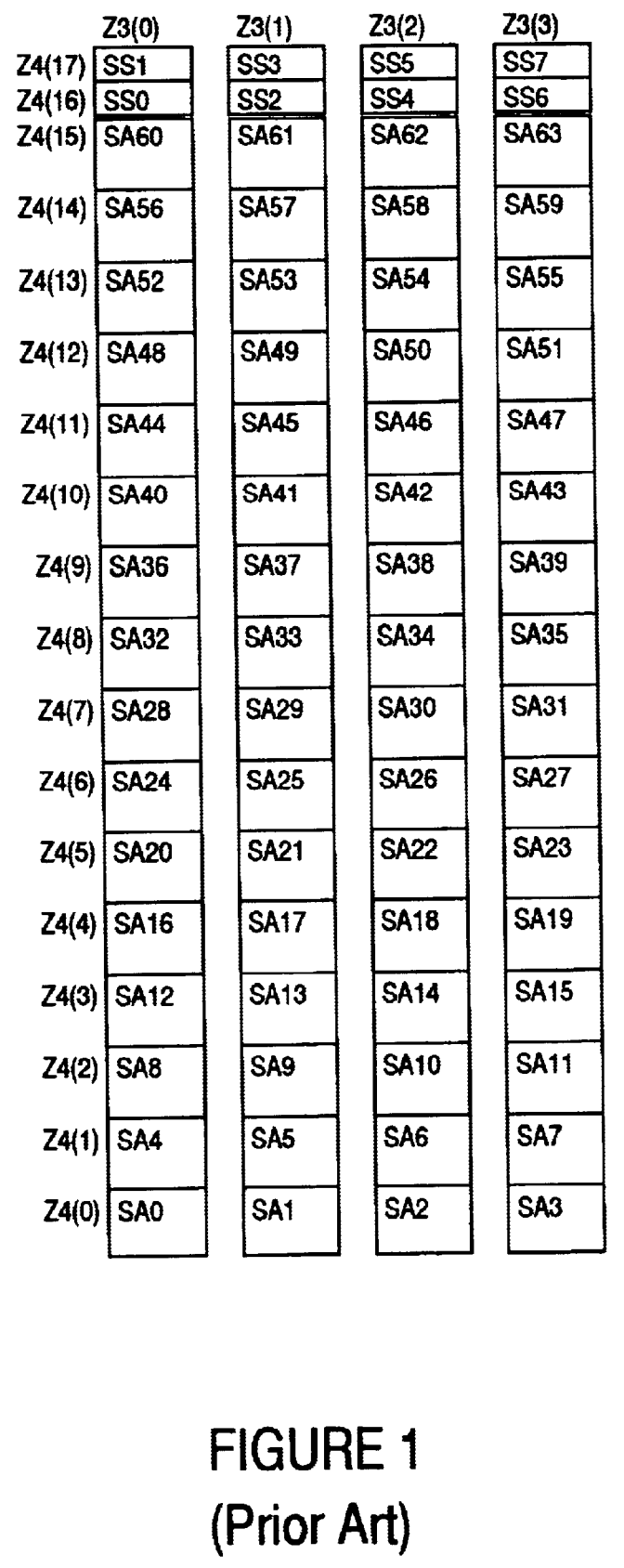

| | Z3(0) | Z3(1) | Z3(2) | Z3(3) |
|---|---|---|---|---|
| Z4(17) | SS1 | SS3 | SS5 | SS7 |
| Z4(16) | SS0 | SS2 | SS4 | SS6 |
| Z4(15) | SA60 | SA61 | SA62 | SA63 |
| Z4(14) | SA56 | SA57 | SA58 | SA59 |
| Z4(13) | SA52 | SA53 | SA54 | SA55 |
| Z4(12) | SA48 | SA49 | SA50 | SA51 |
| Z4(11) | SA44 | SA45 | SA46 | SA47 |
| Z4(10) | SA40 | SA41 | SA42 | SA43 |
| Z4(9) | SA36 | SA37 | SA38 | SA39 |
| Z4(8) | SA32 | SA33 | SA34 | SA35 |
| Z4(7) | SA28 | SA29 | SA30 | SA31 |
| Z4(6) | SA24 | SA25 | SA26 | SA27 |
| Z4(5) | SA20 | SA21 | SA22 | SA23 |
| Z4(4) | SA16 | SA17 | SA18 | SA19 |
| Z4(3) | SA12 | SA13 | SA14 | SA15 |
| Z4(2) | SA8 | SA9 | SA10 | SA11 |
| Z4(1) | SA4 | SA5 | SA6 | SA7 |
| Z4(0) | SA0 | SA1 | SA2 | SA3 |

FIGURE 1
(Prior Art)

SYSTEM AND METHOD FOR ERASE VOLTAGE CONTROL DURING MULTIPLE SECTOR ERASE OF A FLASH MEMORY DEVICE

TECHNICAL FIELD

The present invention relates to a non-volatile memory. Specifically, the present invention relates to a method for controlling the gate voltage applied during the erase of a flash memory device.

BACKGROUND ART

Many electronic devices, such as computers, personal digital assistants, cellular telephones, digital cameras and similar systems and devices include processors and memory. The memory is used to store computer programs to be executed by the device and/or data operated on by the processors to achieve the functionality of the device. Many devices and systems require that this information be retained in permanent storage/non-volatile medium so that the data and computer programs is not lost when power is removed.

Semiconductor memory devices that do not require ambient power to retain the data stored therein have been developed. These devices have been termed "non-volatile" semiconductor memory devices. In common designs for non-volatile semiconductor memory devices, data is erased in units of memory called sectors, and cannot be erased at the byte level. Each sector is partitioned into segments termed a page. Data is accessed for reading and programming by page, while the entire sector is accessed for erasing.

Flash memory (or Flash RAM) is an example of a non-volatile memory device. Flash memory devices use a memory cell transistor with a floating gate structure. The typical memory cell in a flash memory device comprises an access transistor and a storage element, such as a floating gate. Data in the flash memory device are programmed or erased by accumulation or depletion of charge, respectively, on a thin insulating film between a substrate and a floating gate. Programming of the memory cells occurs by applying a sufficient voltage difference to the transistors to cause excess electrons to accumulate on the floating gate. The accumulation of the additional electrons on the floating gate raises the charge on the gate and the transistor's threshold voltage. The transistor's threshold voltage is raised sufficiently above that of the applied voltage during read cycles so that the transistor does not turn on during the read cycles. Therefore, a programmed memory cell will not carry current, representing the logical value "0." The erasure of a sector of data is caused by a process in which a voltage difference is applied to the transistor in each memory cell of the sector to cause the excess electrons on the floating gate in each transistor to evacuate the film. Thereby the transistor's threshold voltage is lowered below that of the voltage potential applied to the transistor to read data. In the erased state, current will flow through the transistor. When the read voltage potential is applied, the current will flow through the transistor of the memory cell, representing a logical value "1" stored in the memory cell.

Prior Art FIG. 1 shows a simplified diagram of an example of a non-volatile memory device which includes a plurality of memory sectors indicated by blocks SA0, SA1, SA2, . . . SA63 and SS0, SS1, SS2, . . . SS7. The memory sectors SA0, SA1, SA2, . . . SA63 and SS0, SS1, SS2, . . . SS7 are arranged in a plurality of rows and columns, with each row containing four memory sectors. The rows of the memory sectors are numbered consecutively from Z4 (0) to Z4 (17), and the columns of the memory sectors are numbered consecutively from Z3(0) to Z3(3). Sectors labeled SA0, SA1, SA2, . . . SA63 may be used for data or code storage, whereas sectors labeled SS0, SS1, SS2, . . . SS7 are reserved for code storage. Each of the sectors comprises an array of memory cells arranged in a plurality of columns and rows. A plurality of word lines are coupled to the respective rows, and a plurality of bit lines are coupled to the respective columns of the memory cells. For example, if each of the sectors labeled SA0, SA1, SA2, . . . SA63 has 64 kilobytes of memory, each sector may include an array comprising 512 word lines and 1,024 bit lines.

In one type of low voltage flash memory device the voltages required for programming and erasing must be produced by charge pumps that have a limited current capability. For example, a device may operate from an external supply voltage of 1.8 volts or 3 volts, and use an internal voltage on the order of 10 volts. For devices relying on charge pumps for erase and program voltages, the number of memory cells that can be simultaneously programmed or erased is limited.

PRIOR ART FIG. 2A shows the typical voltages applied to a memory cell when it is being programmed. The drain D of the memory cell 200 is applied a voltage on the order of about 5 V, the gate G is applied a voltage on the order of about 9 V, and the source S of the memory cell is grounded.

PRIOR ART FIG. 2B shows the typical voltages applied to the source and gate of the memory cell 200 when it is erased using a negative gate erase. The Source S of the memory cell 200 is applied a voltage on the order of about 5 V and the gate G is applied a voltage on the order of about −9 V. An alternative erase method uses a grounded gate and a positively biased source. In the context of a grounded gate, an increasing gate erase voltage refers to an increase in the of the voltage between the gate and source.

In addition to the configuration of FIG. 2B, other erase techniques such as channel erase may be employed. A discussion of channel erase may be found in U.S. Pat. No. 6,188,609, "Ramped or stepped gate channel erase for flash memory application"; the whole of which is incorporated herein by reference.

PRIOR ART FIG. 2C shows the typical voltages applied to the drain, source and gate of the memory cell 200 when it is weakly programmed. The drain D of the memory cell 200 is applied a voltage on the order of about 5 V, and the gate G and source S are grounded. Weak programming, also referred to as Automatic Program Disturb after Erase (APDE), is a self-limiting correction that may be applied to over-erased memory cells.

In order to program a 16-bit word, for example, sixteen columns of memory cells on sixteen bit lines are grouped into four sets, each set comprising four columns. When the memory cells are programmed in a conventional embedded program mode, the conventional internal pump provides pump currents through the respective bit lines to program the memory cells one set of columns at a time. For example, a typical 16-bit word with bits numbered 0–15 may be grouped into four sets of bits numbered 0–3, 4–7, 8–11 and 12–15. When any set of four bits are to be programmed with up to four zeroes, this arrangement ensures that a sufficient pump current is supplied to the drain of each of the memory cells through the respective bit line. When the memory cells are in a conventional embedded chip erase mode, the conventional internal pump has similar limitations in that it is capable of erasing the memory cells by supplying a source voltage to the sources of only one set of memory cells at a time.

Because the conventional internal pump has a limited current supply and is typically capable of programming or erasing the memory cells on the bit lines only one set at a time, it takes a plurality of pulses generated by the internal pump to be supplied to different sets of bit lines during the programming or erase of each word along each word line. Moreover, the power from the internal pump need be switched to different sets of bit lines during the programming or erase of each word. Therefore, programming and erasing of a whole sector of memory cells can be time consuming in the conventional embedded program and erase modes.

In another type of flash memory device, the internal limitations of charge pumps is circumvented by allowing the optional input of an additional higher voltage that can be selected in place of the internal voltage generated by a charge pump. This type of device allows for faster programming and erasing due to the greater current capability. The optional high voltage input provides the capability for delivering an erase pulse to multiple sectors simultaneously. An erase pulse is essentially a voltage applied for a period of time. However, although the number of sectors to which an erase pulse can be applied has been increased, the basic process for applying pulses has remained largely the same as that used to erase a single sector.

In the typical single sector erase process, the erase voltage may be sequentially increased in order to maintain accurate control over the erase/verify process. After a sector has been erased and verified, the erase voltage is reset to an initial value. In multiple sector erase, the erase pulses are applied to a plurality of sectors, and the sectors are verified individually. After an individual sector has been verified, it is possible that one or more of the remaining sectors may require additional pulses. Although there is no harm in resetting the erase voltage after verifying a single sector, any subsequent pulses that are required for the remaining sectors will begin with the reset voltage, which will usually be less than the voltage previously applied. After reset, a number of pulses will be required to achieve an actual increase in applied voltage for the remaining sectors. The extra pulses that are required result in longer overall erase times. Thus, a need exists for an erase voltage control method that provides a reset that does not require an increase in the number of pulses applied during multiple sector erase.

DISCLOSURE OF THE INVENTION

The present invention provides a method for controlling an erase voltage applied during simultaneous multiple sector erase of a flash memory. The method provides for improved erase performance when varying subsets of a group of memory sectors are subjected to a series of erase/verify cycles. During the erase process, each erase pulse applied to a given sector or sectors is equal to or greater than the preceding pulse A method for erasing a flash memory is disclosed. In a flash memory device having multiple sectors, a subset of sectors is selected and an erase pulse is applied simultaneously to all sectors in the subset. After the application of an erase pulse having an initial voltage value, at least one sector of the subset is verified. If there is at least one unerased cell in the verified sector, the erase voltage is adjusted and another erase pulse is applied to the subset of sectors. The adjustment of the erase voltage may be a function of the number of times that an erase pulse has been applied to the subset. This cycle is repeated on the subset until the selected sector is verified as erased. After a sector is verified, the erase/verify cycle is applied to one or more of the remaining sectors in the subset until each of the remaining sectors has been verified as erased. After all of the sectors in the subset are erased, the erase voltage is reset to its initial value and another subset of sectors is selected for erase/verify as described above. The process may be repeated until all of the memory sectors in the device have been erase.

In an embodiment of the present invention, four sectors arc selected in a flash memory device having a multiple of four memory sectors. An erase pulse having an initial erase voltage value is applied to the four sectors and the first sector is verified. The pulse application and verification are repeated until the first sector is verified as erased. During repetition of the erase/verify cycle, a ramp function is applied to the erase pulse voltage value. Upon verification of the first sector as erased, the erase/verify cycle is applied to the second and fourth sectors, with verification being performed on the second sector. Upon verification of the second sector as erased, the erase/verify cycle is then applied to the third sector. Upon verification of the third sector as erased, the erase/verify cycle is applied to fourth sector. After verification of the fourth sector as erased, the erase pulse voltage value is reset to its initial value.

In a further embodiment, a flash memory device may have embedded logic for selection of multiple sectors and the determination of the applied gate erase voltage. The embedded logic may also provide preprogram, weak programming (APDE) and verify functions.

BRIEF DESCRIPTION OF THE DRAWINGS

PRIOR ART FIG. 1 a typical arrangement of memory sectors in a typical non-volatile memory device.

PRIOR ART

PRIOR ART

PRIOR ART

BEST MODES FOR CARRYING OUT THE INVENTION

Reference will now be made in detail to the preferred embodiments of the present invention, a system and method for erase voltage control during multiple sector erase of a flash memory device. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 2A:
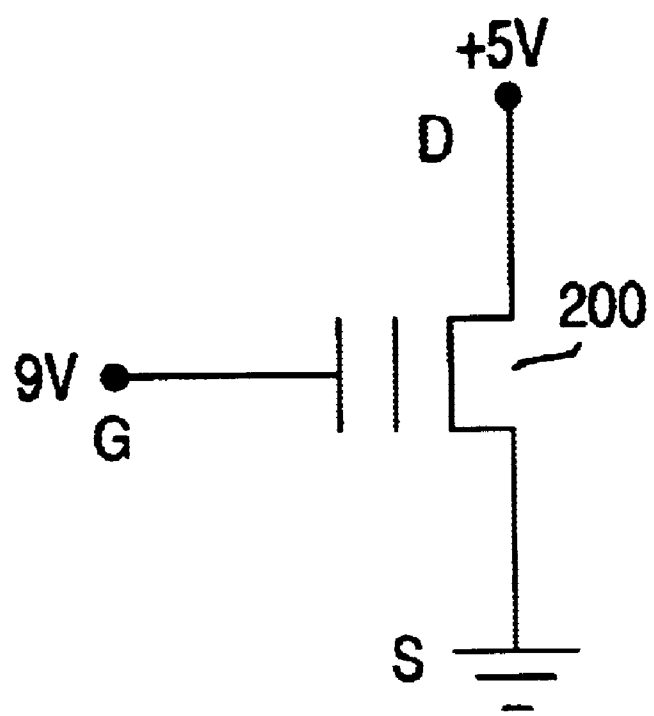
FIG. 2A shows an embodiment of voltages applied to the drain, source and gate of a memory cell comprising a typical binary dual-gate NOR device when it is programmed in the fast program mode.
Figure 2B:
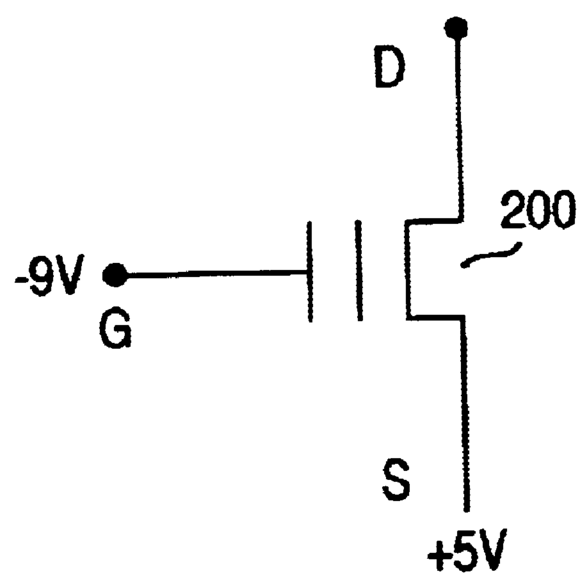
FIG. 2B shows an embodiment of voltages applied to the drain, source and gate of the memory cell as shown in FIG. 2A when it is erased in the fast chip erase mode.
Figure 2C:
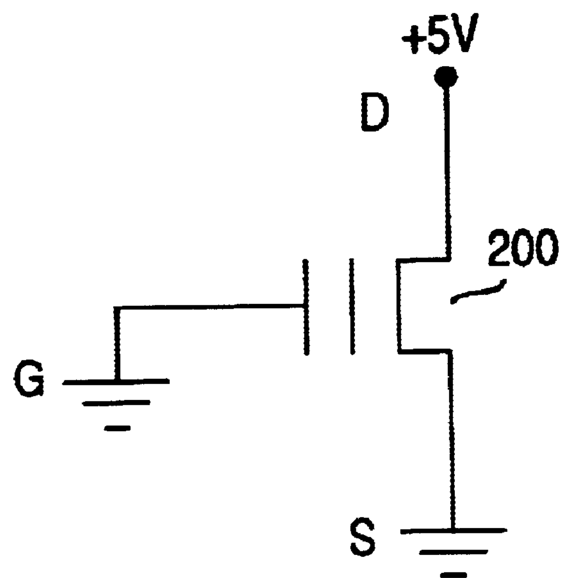
FIG. 2C shows an embodiment of voltages applied to the drain, source and gate of the memory cell as shown in FIG. 2A when it is weakly programmed (APDE) in the fast chip erase mode.
Figure 3:
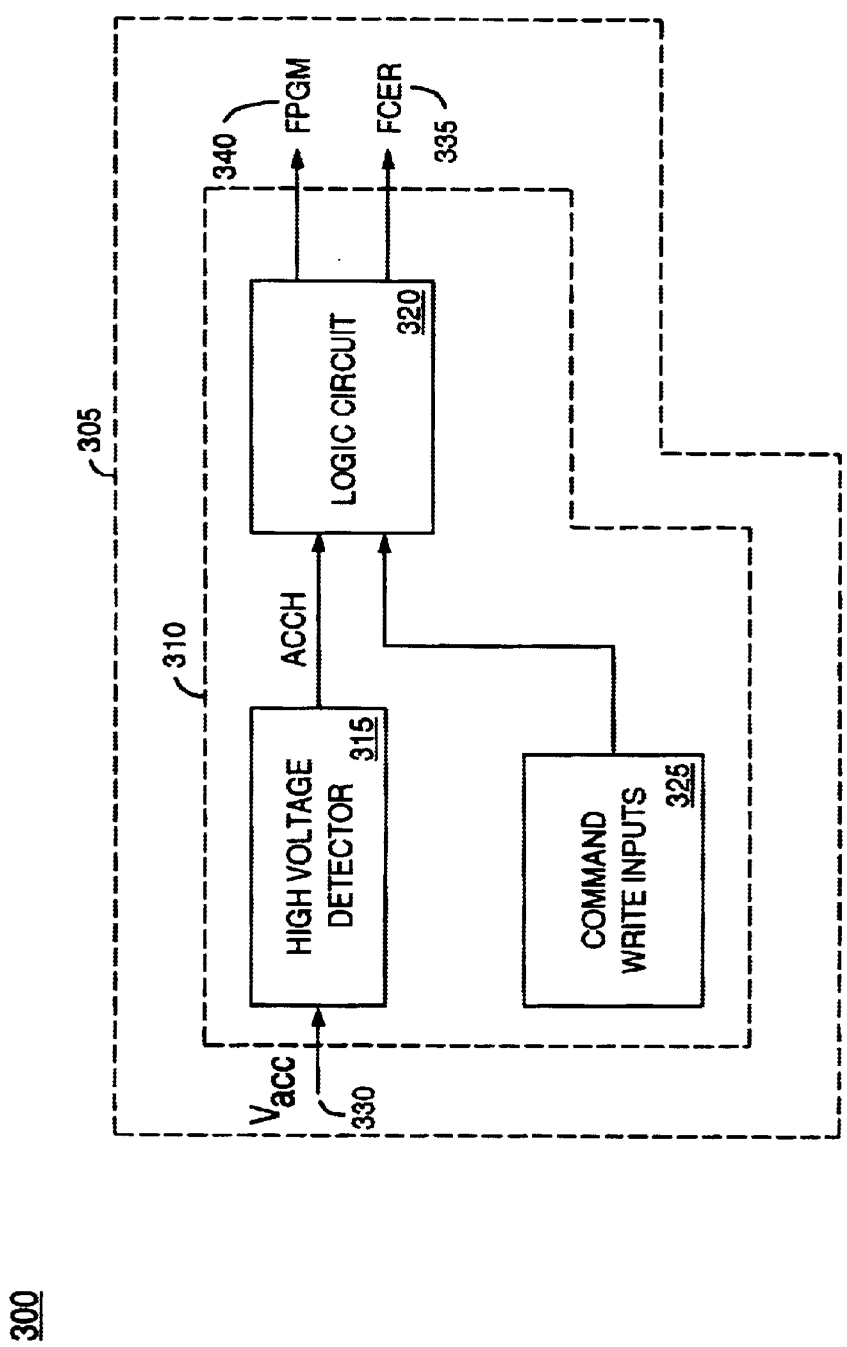
FIG. 3 shows a block diagram of an acceleration circuit in accordance with an embodiment of the present claimed invention.

FIG. 3 shows a block diagram of an acceleration circuit in accordance with an embodiment of the present claimed invention.

FIG. 3 shows a block diagram of an acceleration circuit 305 for fast programming and fast chip erase of the memory cells in accordance with the present invention. A detailed discussion of the acceleration circuit 305 may be found in U.S. Pat. No. 6,208,558 issued Mar. 27, 2001; the full disclosure of which is incorporated herein by reference. The acceleration circuit 305 generally comprises an acceleration input 330 which is capable of providing an acceleration voltage $V_{acc}$ to supply a current for programming the memory cells on all sets of bit lines at a time in a fast program mode. Furthermore, the acceleration circuit 305 comprises a triggering circuit 310, coupled to the acceleration input 330, capable of disabling the internal voltage supply pump 405 (shown in FIGS. 4 and 5), and enabling the acceleration voltage $V_{acc}$ to be supplied to the bit lines in all of the sets at a time in response to a presence of the acceleration voltage $V_{acc}$ at the acceleration input 330. The acceleration voltage $V_{acc}$ may be supplied from an acceleration pin (630 in FIG. 6), which serves as the acceleration input 330 and is capable of receiving the acceleration voltage $V_{acc}$ from a source external to the integrated circuit chip for the non-volatile memory.

In the embodiment shown in FIG. 3, the triggering circuit 310 comprises a high voltage detector 315, coupled to the acceleration input 330 to receive the acceleration voltage $V_{acc}$, which in an embodiment is in the range of about 7 V to about 10 V. The high voltage detector 315 generates an acceleration voltage indicator signal ACCH upon detecting the acceleration voltage $V_{acc}$ at the acceleration input 330, and feeds the acceleration voltage indicator signal ACCH to a logic circuit 320.

The logic circuit 320, which has an input coupled to receive the acceleration voltage indicator signal ACCH from the high voltage detector 315, also has at least one command write input 325 to set the non-volatile memory array in a fast mode of operation. In an embodiment in which the non-volatile memory array is to be set in a fast program mode, the command write inputs 325 comprise a program command write input capable of receiving a program command. In an additional embodiment in which the non-volatile memory array is to be set in a fast chip erase mode, the command write inputs 325 further comprise an erase command write input capable of receiving an erase command.

The logic circuit 320 has an output which is capable of generating a fast program command FPGM 340 to set the non-volatile memory array in a fast program mode in response to the presence of the acceleration voltage indicator signal ACCH generated by the high voltage detector 315 and the presence of the program command at the program command write input 325. In an additional embodiment, logic circuit 320 has a second output which is capable of generating a fast chip erase command FCER 335 to set the non-volatile memory array in a fast chip erase mode. The logic circuit 320 generates the fast chip erase command FCER 335 in response to the presence of the acceleration voltage indicator signal ACCH from the high voltage detector 315 and the presence of the erase command at the erase command write input 325.

Figure 4:
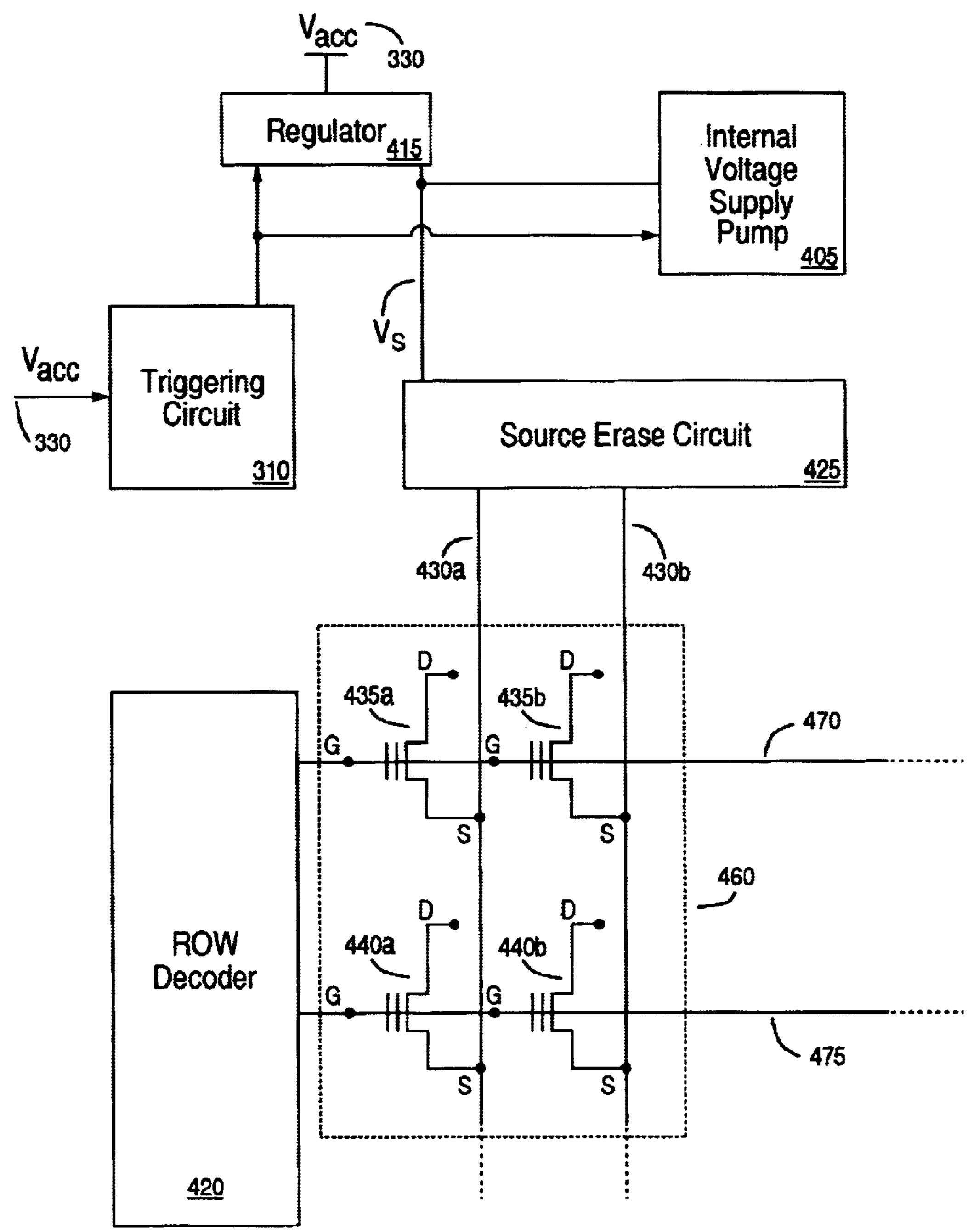
FIG. 4 is a circuit diagram showing an acceleration circuit supplying a source voltage to the sources of the memory cells during the step of performing a fast erase operation in a fast chip erase mode in accordance with an embodiment of the present claimed invention.

FIG. 4 shows a circuit diagram of an embodiment of the memory array 460 during a fast erase operation in the fast chip erase mode in accordance with the present invention. In this embodiment, the regulator 415 is coupled to the acceleration input 330 to reduce the acceleration voltage $V_{ACC}$, which is in the range of about 7 V to about 10 V in an embodiment, to a source voltage $V_S$, which is typically on the order of about 5 V to erase the memory cells with bit "1".

As shown in FIG. 4, the regulated voltage $V_S$ is supplied to the sources of the memory cells including memory cells 435*a*, 435*b*, 440*a* and 440*b* in the memory array 460 through a source erase circuit 425, which in an embodiment may be a conventional source erase circuit known to a person skilled in the art to distribute the regulated voltage $V_S$ to the sources of the memory cells 435*a*, 435*b*, 440*a*, 440*b*, . . . Referring to FIG. 4, the voltage $V_S$ is supplied to the memory cells 435*a*, 440*a* and 435*b*, 440*b* through source lines 430*a* and 430*b*, respectively. During the step of performing the fast erase operation on the memory cells in the fast chip erase mode, a gate voltage, typically on the order of about −9 V, is supplied to the word lines to which the gates of the memory cells are connected. The drains of the memory cells 435*a*, 440*a* and 435*b*, 440*b* are floating during the step of performing the fast erase operation.

Since the source voltage $V_S$ during the fast erase operation in the fast chip erase mode is the same as the drain voltage $V_D$, which is typically on the order of about 5 V for typical dual-gate NOR memory cells during fast preprogramming and fast weak programming (APDE) operations, the same regulator 415 is implemented to reduce the acceleration voltage $V_{ACC}$, which is in the range of about 7 V to about 10 V in an embodiment, to a regulated voltage of about 5 V both as a drain voltage for fast preprogramming and fast APDE operations and as a source voltage for the fast erase operation. Furthermore, the same regulator 415 is used for generating the drain voltage $V_D$ on the order of about 5 V in the fast program mode.

Figure 5:
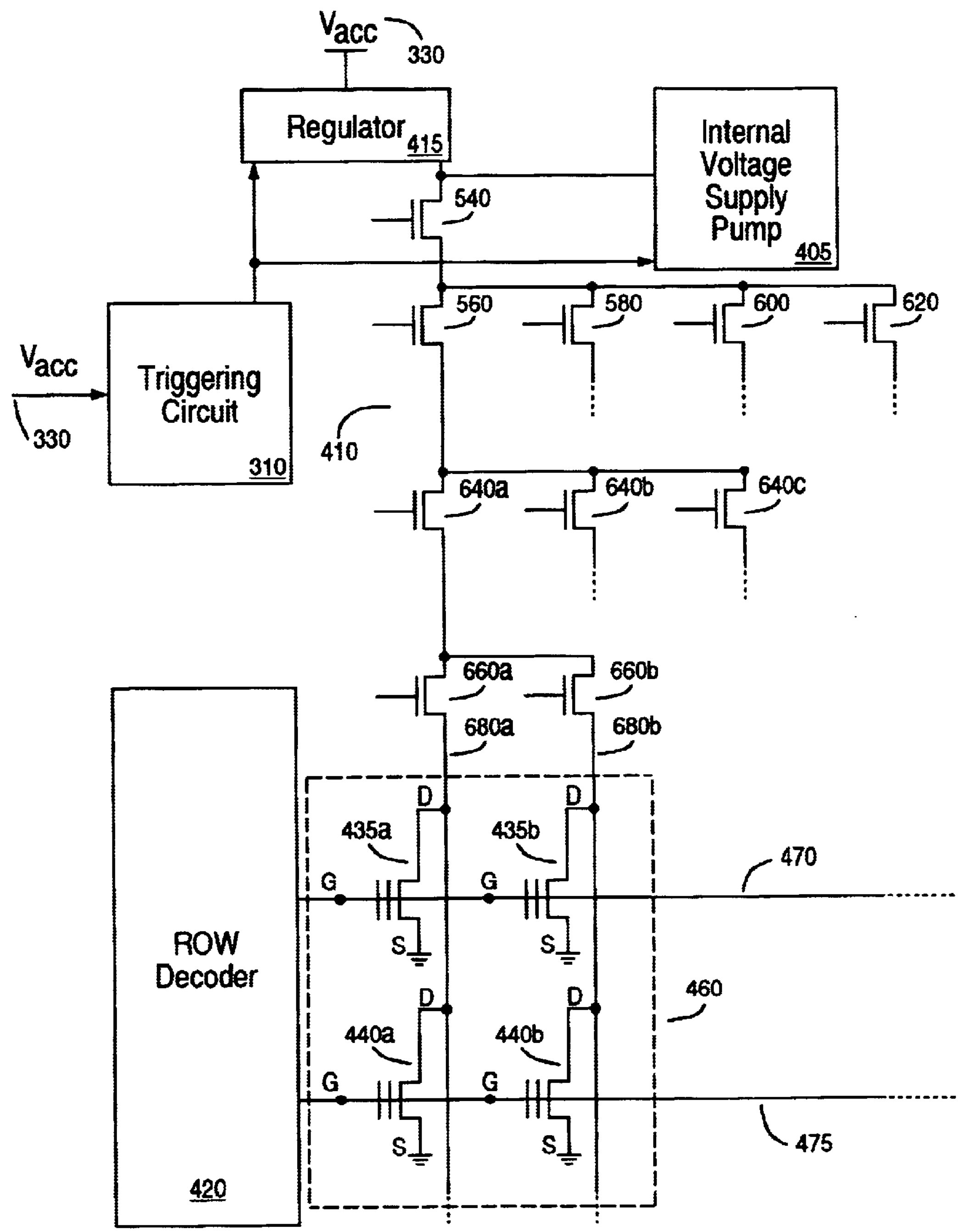
FIG. 5 is a circuit diagram showing an acceleration circuit supplying a drain voltage to the drains of the memory cells during the step of performing a fast weak programming (APDE) operation in the fast chip erase mode in accordance with an embodiment of the present invention.

FIG. 5 shows a circuit diagram of a memory sector including a memory array 460, a row decoder, also called an X-decoder 420, a column decoder, also called a Y-decoder 410, a triggering circuit 310, and an acceleration input 330 when the memory array 460 is in a fast program mode. In this embodiment, a fast program command signal FPGM generated by the triggering circuit 310 allows the acceleration input 330 to supply power to generate the drain voltage $V_D$. In an embodiment in which the acceleration voltage $V_{ACC}$ is in the range of about 7 V to about 10 V, a regulator 415 is coupled to the acceleration input 330 to reduce the acceleration voltage $V_{ACC}$ to a desired drain voltage $V_D$, which in an embodiment is on the order of about 5 V for conventional flash memory cells comprising dual-gate NOR devices.

In the example shown in FIG. 5, a fast programming switch 540 comprises a conventional MOS transistor which is capable of supplying the drain voltage $V_D$ to the Y-decoder 410. In an embodiment, the Y-decoder 410 comprises multiple rows of conventional MOS transistors to selectively distribute the current produced by the drain voltage $V_D$ to the bit lines in the memory array. In the example illustrated in FIG. 5, the Y-decoder 410 comprises four first-level MOS transistors 560, 580, 600 and 620 coupled to the fast programming transistor 540. The current from each of the first-level transistors 560, 580, 600 and 620 is routed to a plurality of second-level MOS transistors. For example, the current flowing from the first-level transistor 560 is routed to second-level transistors 640*a*, 640*b*, 640*c*, . . . Furthermore, each of the second level transistors 640*a*, 640*b*, 640*c*, . . . is coupled to two third-level MOS transistors, each of which is connected to a respective bit line in the memory array 460 to supply the programming current to the drain of a memory cell on the respective bit line. For example, the second-level transistor 640*a* is coupled to two third-level transistors 660*a* and 660*b* which distribute programming currents to bit lines 680*a* and 680*b*, respectively.

The number of rows of transistors and the number of transistors within each row in the Y-decoder 410 depends upon the number of bit lines in each sector of memory array. If the regulator 415 is coupled to supply programming currents to 64 bit lines, for example, four first-level MOS transistors are coupled to the fast programming transistor 540, eight second-level MOS transistors are coupled to each of the first-level transistors, and two third-level MOS transistors are coupled to each of the second-level transistors in the Y-decoder 410.

In the fast program mode, the MOS transistors in the Y-decoder 410 may be selectively turned on or off to selectively program the bit lines, but all of the bit lines selected to be programmed in the array 460 are supplied with a single pulse of drain voltage $V_D$ when each word is programmed in the fast program mode. The column decoding scheme as shown in FIG. 5 is merely an illustrative example of means for supplying the current produced by the acceleration voltage $V_{ACC}$ to each of the bit lines in a flash memory array. However, the present invention is not limited to the column decoding scheme as shown in FIG. 5. Other column decoding schemes can also be used to distribute the current from the acceleration input 2 to the bit lines in the memory array within the scope of the present invention.

In a further embodiment, The acceleration voltage $V_{ACC}$ may be supplied to the word lines as a gate voltage for the memory cells in the fast program mode. FIG. 5 shows a portion of the memory array 460 with four memory cells 435*a*, 435*b*, 440*a* and 440*b* each comprising a conventional dual-gate NOR device. The gates of the memory cells 435*a* and 435*b* are connected to the X-decoder 420 through word line 470, while the gates of the memory cells 440*a* and 440*b* are connected to the X-decoder 420 through word line 475. Although the gate turn-on voltage for a typical dual-gate NOR device is typically on the order of about 9 V, a voltage on the order of about 7 V to 10 V is sufficient to turn on the NOR devices on the word line selected to be programmed.

The gates of the NOR devices in each row are connected to a respective word line. The current flowing through the word line selected to be programmed is negligibly small because the word line is used only to supply a gate voltage to the memory cells in the respective row. Therefore, the power supply for the X-decoder 420 is usually not critical to the limitations of current supply by the power source.

Referring again to FIG. 4, in an embodiment, the acceleration voltage $V_{ACC}$ is, supplied from the acceleration input 330 to the X-decoder 420 without regulation. When the memory array 460 is in the fast program mode, the word lines 470, 475, . . . in the memory array 460 may be turned on successively one at a time to program the memory cells on each word line. For example, when the acceleration voltage $V_{ACC}$ is supplied to the word line 470, the NOR devices 435*a* and 435*b* are turned on. When the drain voltage $V_D$, which is generated by the regulator 415 by reducing the acceleration voltage $V_{ACC}$, provides the programming current through the fast programming switch 540 and the Y-decoder 410 to the drain of the memory cell 435*a*, for example, memory cell 435*a* is programmed with bit "0".

Figure 6:
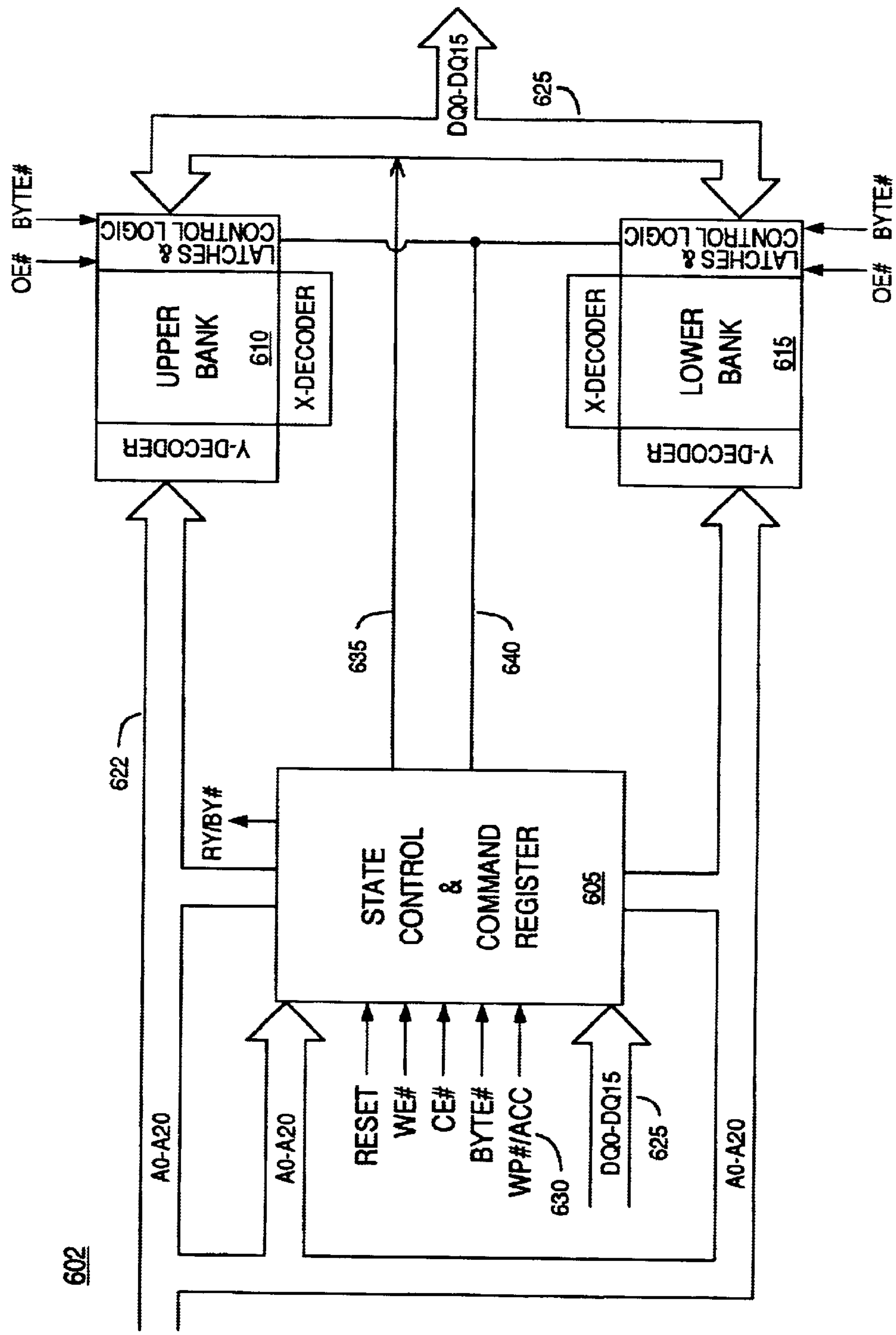
FIG. 6 is a circuit diagram of a flash memory device incorporating a fast chip erase capability in accordance with an embodiment of the present claimed invention.

After all of the memory cells along the word line 470 are programmed, the unregulated acceleration voltage $V_{ACC}$ is supplied to the next word line 475 by the X-decoder 420 to turn on the memory cells along the word line 475. A single pulse of drain voltage $_{VD}$ is then capable of programming all of the memory cells including memory cells 440*a* and 440*b* along the word line 475 with bit "0". In the fast program mode according to the present invention, the sources of the memory cells are grounded. The circuit of FIG. 5 may be used to perform either fast programming or fast weak programming (APDE). For APDE, the word lines 470 and 475 are grounded FIG. 6 is a circuit diagram 602 of a flash memory device incorporating a fast chip erase capability in accordance with an embodiment of the present claimed invention. The device has an address bus 622 coupled to a State Control and Command Register 605, an Upper Bank 610 and a Lower Bank 615. In this embodiment, Upper Bank 610 and Lower Bank 615 are memory arrays that may be written to and read from simultaneously. Upper Bank 610 and Lower Bank 615 are each coupled to respective Y-decoder, X-decoder, and latches and control logic. A data bus 625 is also coupled to the State Control and Command Register 605, Upper Bank 610 and Lower Bank 615. A WP#/ACC pin 630 is used as an input for both write protect and for $V_{ACC}$. The State Control and Command Register 605 is coupled to the data bus 625 by a status line 635 and is coupled to the Upper Bank 610 and Lower Bank 615 by a control line 640. The State Control and Command Register 605 may provide embedded preprogram, erase, verify, and APDE functions and a RY/BY# (ready/busy) status indicator. Control inputs include CE# (chip enable), WE# (write enable), OE# (output enable) and RESET.

Figure 7A:
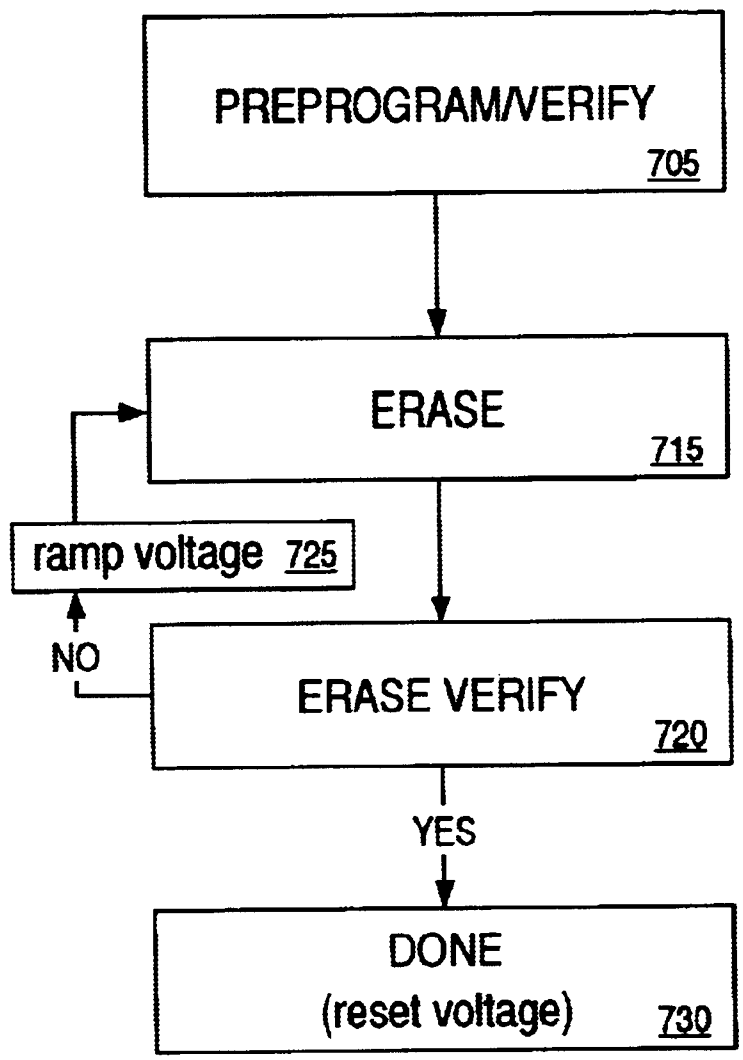
FIG. 7A shows a flowchart diagram for an overall erase process in accordance with an embodiment of the present claimed invention.

FIG. 7A shows a flowchart diagram for an overall erase process in accordance with an embodiment of the present invention. In step 705, preprogramming/verify is performed to set all bits in a set of memory cells within a flash memory device to zero. This is done to normalize the threshold voltages of the transistors of the set of memory cells so that the a more uniform initial behavior is obtained. In step 715, an erase voltage is applied to a set of memory cells. In step 720, the erase performed in step 715 is verified. If the set of memory cells is not fully erased, then the erase voltage is ramped in step 725 and step 715 repeated. When repeating step 715, the set of memory cells may or may not be the same as the prior set. If the set of memory cells is verified as erased, then the erase voltage is reset in step 730. The process shown in FIG. 7A may be used in an iterative fashion to erase a flash memory device.

Figure 7B:
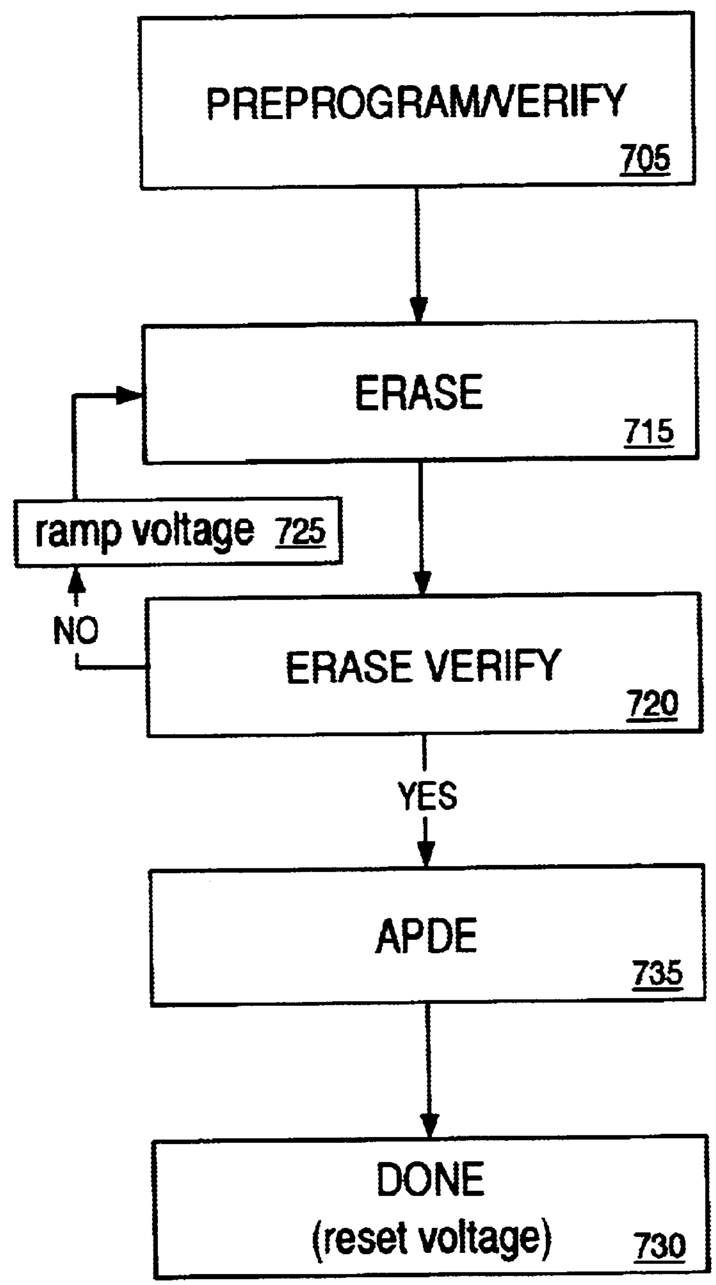
FIG. 7B shows a flowchart diagram for an overall erase process comprising APDE in accordance with an embodiment of the present claimed invention.

FIG. 7B shows a flowchart diagram for an overall erase process comprising APDE in accordance with an embodiment of the present invention. In step 705, preprogramming/verify is performed to set all bits in a set of memory cells within a flash memory device to zero. In step 715, an erase voltage is applied to the set of memory cells. In step 720, the erase performed in step 715 is verified. If the set of memory cells is not fully erased, then the erase voltage is ramped in step 725 and step 715 repeated. When repeating step 715, the set of memory cells may or may not be the same as the prior set. If the set of memory cells is verified as erased, then an APDE step is performed in step 735. In step 730, the erase voltage is reset. The process shown in FIG. 7B may be used in an iterative fashion to erase a flash memory device.

As shown in FIGS. 7A and 7B, the overall erase process may include preprogramming and APDE steps to minimize variability and provide correction to overerase and under-erase. In the present invention, when the steps of erase and erase verify are applied repeatedly to selected subsets of a group of sectors that is being erased, the gate erase voltage that is applied increases monotonically. That is, from the time that the group of sectors is selected for erase, to the time that the last sector in the group is verified as erase after the application of a series of erase pulses, the applied gate erase voltage is never decreased. The gate erase voltage is only decreased (reset) upon selection of another group of unerased sectors.

Figure 8:
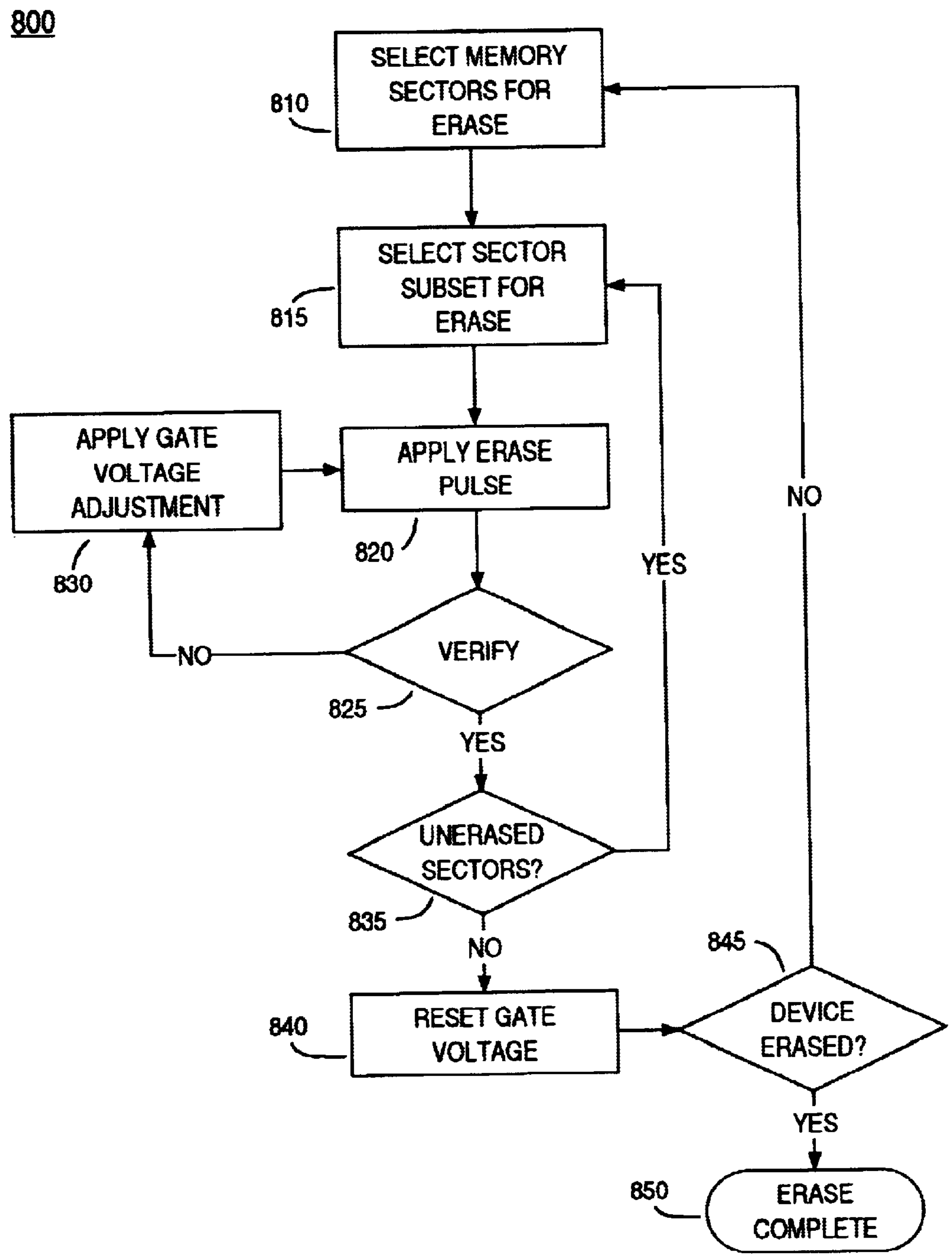
FIG. 8 shows a flow chart diagram for a multiple sector simultaneous erase in accordance with an embodiment of the present claimed invention.

FIG. 8 shows a flow chart diagram 800 for a multiple sector simultaneous erase in accordance with an embodiment of the present invention. In step 810, a group of memory sectors within a flash memory device is selected. When the group of sectors is selected for erase, the gate erase voltage is set to an initial value. In step 810, a subset of the group selected in step 805 is selected for application of an erase pulse. In step 820, An erase pulse is applied to the subset of sectors selected in step 815. The subset of step 815 may include all of the sectors in the group. In step 825, one or more of the sectors in the subset are erase verified. If the sectors(s) verified in step 825 are not erased, then an adjustment is made to the gate erase voltage in step 830. It should be noted that the order in which steps 820 and 825 are performed may be reversed. The gate erase voltage may be increased as a matter of course, or the voltage may be increased only if a certain number of pulsed has been applied at the present voltage. For example, an initial gate voltage of −5.2 V would be lowered by .13 V to −5.33 V after four pulses had been applied at −.52 V. In this example, the voltage would be lowered until memory cells were verified as erased, or a maximum gate voltage was reached, e.g., −9.2 V.

If the memory sectors are verified as erased in step 825, then a check is made in step 835 to see if there are any unerased sectors within the group. If there are unerased sectors in step 835, then step 815 is repeated. If there are no unerased sectors remaining in the group, then the gate erase voltage is reset at step 840 and a check is made in step 845 to see if there are any unerased sectors remaining in the device. If there are unerased sectors remaining in the device, then step 810 is repeated. If there are not unerased sectors remaining in the device, then the erase is complete at step 850.

Figure 9:
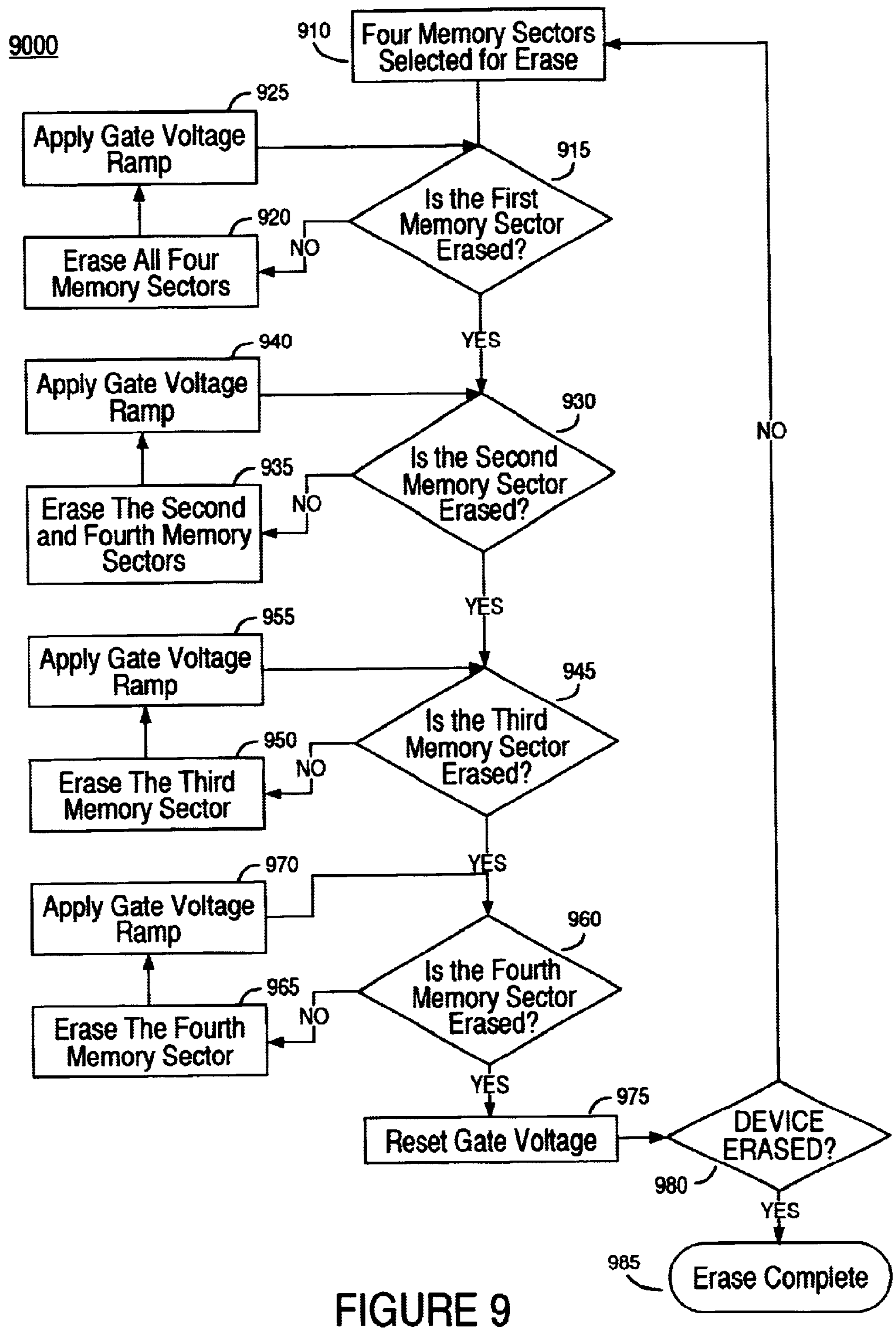
FIG. 9 shows a flow chart diagram for a four-sector simultaneous erase in accordance with an embodiment of the present claimed invention.

FIG. 9 shows a flow chart diagram for a four-sector simultaneous erase in accordance with an embodiment of the present invention. In step 910, four memory sectors within a flash memory device are selected for erase. In step 915, the first of the four memory sectors is verified. If the first memory sector is not verified as erased, then an erase pulse is applied to all four memory sectors at step 920. In step 925, a gate voltage ramp is applied. The gate erase voltage may be increased with each pulse, or it may be increased after a number of pulses at a given voltage. Steps 915, 920, and 925 are repeated until the first sector is verified as erased.

In step 930, the second memory sector is verified. If the second memory sector is not verified as erased, then an erase pulse is applied to the second and fourth memory sectors at step 935. In step 940, a gate voltage ramp is applied. The gate erase voltage may be increased with each pulse, or it may be increased after a number of pulses at a given voltage. Steps 930, 935, and 940 are repeated until the second sector is verified as erased.

In step 945, the third memory sector is verified. If the third memory sector is not verified as erased, then an erase pulse is applied to the third memory sector at step 950. In step 955, a gate voltage ramp is applied. The gate erase voltage may be increased with each pulse, or it may be increased after a number of pulses at a given voltage. Steps 945, 950, and 955 are repeated until the third sector is verified as erased.

In step 960, the fourth memory sector is verified. If the fourth memory sector is not verified as erased, then an erase pulse is applied to the fourth memory sector at step 965. In step 970, a gate voltage ramp is applied. The gate erase voltage may be increased with each pulse, or it may be increased after a number of pulses at a given voltage. Steps 960, 965, and 970 are repeated until the fourth sector is verified as erased.

After the fourth memory sector is verified as erased at step 960, the gate voltage is reset at step 975. In step 980, a check is made to see if there are any more unerased sectors. If there are no remaining unerased sectors, then the device erase is complete at step 985. If there are remaining unerased sectors, then step 910 is repeated, and the process continues until the device is erased.

The processes shown in FIG. 8 and FIG. 9 may be embedded in the logic of the flash memory device (e.g. the state control and command register control 605 of FIG. 6). When the erase process is embedded, a simple command may be used to initiate the erase of an entire chip.

What is claimed is:

1. A method for controlling gate voltage during an erase of a flash memory device comprising a plurality of memory sectors, the method comprising:

a) selecting a portion of said plurality of memory sectors (810);

b) selecting an unerased subset of said portion of said plurality of memory sectors (815);

c) applying an erase pulse having a gate erase voltage to the subset of memory sectors (820);

d) selecting a memory sector from the subset and erase verifying the selected sector (825);

e) if the selected sector is not erased, applying a monotonically increasing function to said gate erase voltage (830);

f) repeating c) through e) until said subset of memory sectors is erased;

g) repeating steps b) through f) until said portion of said plurality of memory sectors is erased;

h) resetting said gate erase voltage (840); and:

i) repeating steps a) through h) until said plurality of memory sectors is erased (850).

2. The method of claim 1, wherein said gate erase voltage is negative.

3. The method of claim 1, wherein said method is embedded in said flash memory device 602.

4. The method of claim 1, further comprising applying an Automatic Program Disturb after Erase (APDE) (735) pulse.

5. The method of claim 1, wherein said gate erase voltage is obtained from a source external to said flash memory device 602.

6. The method of claim 1, further comprising applying a preprogram pulse (705).

7. The method of claim 1, wherein said gate is grounded and said source is positively biased.

8. A method for controlling the gate voltage during the erase of a flash memory device comprising a plurality of memory sectors, the method comprising:

a) selecting a first, second, third and fourth of said plurality of memory sectors (910);

b) erase verifying said first memory sector (915);

c) if said first memory sector is not erased, applying a gate erase voltage to said first, second, third and fourth memory sectors for a period of time (920);

d) applying a monotonically increasing function to said gate erase voltage (925);

e) repeating b) through d) until said first memory sector is erased;

f) erase verifying said second memory sector (930);

g) if said second memory sector is not erased, applying the gate erase voltage to said second and fourth memory sectors for a period of time (935);

h) applying a monotonically increasing function to the gate erase voltage (940);

i) repeating f) through h) until said second memory sector is erased;

j) erase verifying said third memory sector (945);

k) if said third memory sector is not erased, applying the gate erase voltage to said third memory sector for a period of time (950);

l) applying a monotonically increasing function to the gate erase voltage (955);

m) repeating j) through l) until said third memory sector is erased;

n) erase verifying said fourth memory sector (960);

o) if said fourth memory sector is not erased, applying the gate erase voltage to the fourth memory sector for a period of time (965);

p) applying a monotonically increasing function to the gate erase voltage (970);

q) repeating n) through p) until said fourth memory sector is erased; and, r) repeating a) through )q) until said plurality of memory sectors is erased.

9. The method of claim 8, wherein said gate erase voltage is negative.

10. The method of claim 8, wherein said method is embedded in said flash memory device (600).

11. The method of claim 8, further comprising applying an Automatic Program Disturb after Erase (APDE) (735) pulse.

12. The method of claim 8, wherein said gate erase voltage is obtained from a source external to said flash memory device (600).

13. The method of claim 8, further comprising applying a preprogram pulse (705).

14. The method of claim 8, wherein said gate is grounded and said source is positively biased.

15. The method of claim 8, wherein said monotonically increasing function comprises lowering said gate voltage by 0.13 volts after every fourth pulse.

16. The method of claim 8 comprising using an initial gate erase voltage of −5.2 volts.

17. The method of claim 8 wherein the gate voltage is limited to −9.2 volts.

18. A flash memory device comprising:

a plurality of memory sectors (610,615);

embedded logic for selecting a subset of said plurality of memory sectors (605);

logic for applying a monotonically increasing gate erase voltage in a series of pulses to memory sectors in the subset until the memory sectors in the subset are erased (605); and logic for resetting the gate erase voltage (605).

19. The flash memory device of claim 18, wherein said subset comprises four memory sectors.

20. The flash memory device of claim 18, wherein the first pulse in said series is applied to all memory sectors in said subset.

* * * * *